United States Patent
Suh

(10) Patent No.: US 6,773,985 B2
(45) Date of Patent: Aug. 10, 2004

(54) METHOD FOR FORMING DRAM CELL

(75) Inventor: Jai Bum Suh, Gyeonggi-do (KR)

(73) Assignee: Hynix Semiconductor, Inc, Gyeonggi-do (KR)

( * ) Notice: Subject to any disclaimer, the term of this patent is extended or adjusted under 35 U.S.C. 154(b) by 0 days.

(21) Appl. No.: 10/608,145

(22) Filed: Jun. 30, 2003

(65) Prior Publication Data
US 2004/0014329 A1 Jan. 22, 2004

(30) Foreign Application Priority Data
Jul. 18, 2002 (KR) .................................. 10-2002-0042087

(51) Int. Cl.$^7$ .......................................... H01L 21/8242
(52) U.S. Cl. ...................... 438/243; 438/386; 438/270
(58) Field of Search ................................. 438/243, 244, 438/245, 246, 247, 248, 249, 386–392, 136–138, 206, 241, 242, 268, 270, 271

(56) References Cited

U.S. PATENT DOCUMENTS 4,876,215 A * 10/1989 Hsu ........................... 438/209

* cited by examiner

Primary Examiner—Jack Chen
(74) Attorney, Agent, or Firm—Jacobson Holman PLLC

(57) ABSTRACT

A method for forming a DRAM cell wherein a semiconductor substrate having an n$^+$ buried layer is etched to form a contact hole for storage electrode, and a MOS transistor of vertical structure having the n$^+$ buried layer as an impurity region is formed therein is disclosed.

1 Claim, 8 Drawing Sheets

METHOD FOR FORMING DRAM CELL

BACKGROUND OF THE INVENTION

1. Field of the Invention

The present invention generally relates to a method for forming DRAM cell, and more specifically, to a method for forming a DRAM cell wherein a semiconductor substrate having an $n^+$ buried layer is etched to form a contact hole for storage electrode, and a MOS transistor of vertical structure having the $n^+$ buried layer as an impurity region is formed therein to allow read and write operations without loss of charges due to leakage currents.

2. Description of the Prior Art

FIGS. 1a through 1e are cross-sectional diagrams illustrating a conventional method for forming a DRAM cell.

Referring to FIG. 1a, a MOS transistor 15 having a gate electrode 17 is formed on a semiconductor substrate 11 including a device isolation film 13 defining an active region. The gate electrode 17 has a hard mask layer 19 thereon and a gate oxide film (not shown) thereunder. An insulating film spacer 21 is disposed on a side wall of the gate electrode 17.

Referring to FIG. 1b, a first interlayer insulating film 23 is formed on the entire surface and then planarized.

Thereafter, the first interlayer insulating film 23, the gate oxide film and the semiconductor substrate 11 are etched via a photolithography process using a storage electrode contact mask to form a trench 25.

Referring to FIG. 1c, a polysilicon liner layer(not shown) is formed on the entire surface, and then planarized via chemical mechanical polishing process to expose the first interlayer insulating film 23, thereby forming a storage electrode 27 on the inner wall of the trench 25.

Referring to FIG. 1d, a dielectric film 29 and a polysilicon layer for plate electrode are sequentially formed on the entire surface. The polysilicon layer for plate electrode and the dielectric film 29 are etched via a photolithography process using a plate electrode mask to form a plate electrode 31.

Referring to FIG. 1e, a second interlayer insulating film 33 is formed on the entire surface and then planarized.

Thereafter, the second interlayer insulating film 33, the first interlayer insulating film 33 and the gate oxide film are etched via a photolithography process using a bit line contact mask to form a bit line contact hole. A bit line 35 is then formed by filling up the bit line contact hole.

In accordance with the above-described conventional method for forming DRAM cell, data stored in the cell is lost due to leakage currents such as a leakage current in a capacitor and a leakage current between device isolation films, resulting in degradation of refresh characteristics and requirement of capacitors having large capacitance.

SUMMARY OF THE INVENTION

It is an object of the present invention to provide a method for forming DRAM cell wherein a MOS transistor of vertical structure having an $n^+$ buried layer on a semiconductor substrate as an impurity region is formed in a contact hole for storage electrode to allow read and write operations without loss of charges due to leakage currents.

In order to achieve the above object of the present invention, the method for forming a DRAM cell comprises the steps of: forming a buried layer by implanting a high concentration impurity into a semiconductor substrate; forming a MOS transistor having a first gate oxide film, a first gate electrode, a source and drain region; forming a planarized first interlayer insulating film on the entire surface; etching a portion of the first interlayer insulating film on the drain region, the drain region, and a portion of the semiconductor substrate below the drain region to expose the buried layer, whereby forming a contact hole for storage electrode; forming a vertical MOS transistor in the contact hole by forming a second gate oxide film pattern whose both ends are respectively overlapped on the drain regions and a second gate electrode overlapped on the second gate oxide; forming a storage electrode on the second gate electrode so that the both ends are repectively extending on the drain regions; forming a dielectric layer and a plate electrode on the storage electrode; forming a planarized second interlayer insulating film on the entire surface; sequentially etching the second interlayer insulating film and the first interlayer insulating film on the source region to expose the source region, whereby forming a bit line contact hole; and forming a bit line contacting the source region through bit line contact hole.

DETAILED DESCRIPTION OF THE PREFERRED EMBODIMENTS

The present invention will be explained in detail referring to the accompanying drawings.

FIGS. 2a through 2g are cross-sectional diagrams illustrating method for forming a DRAM cell in accordance with the present invention.

Figure 1A:
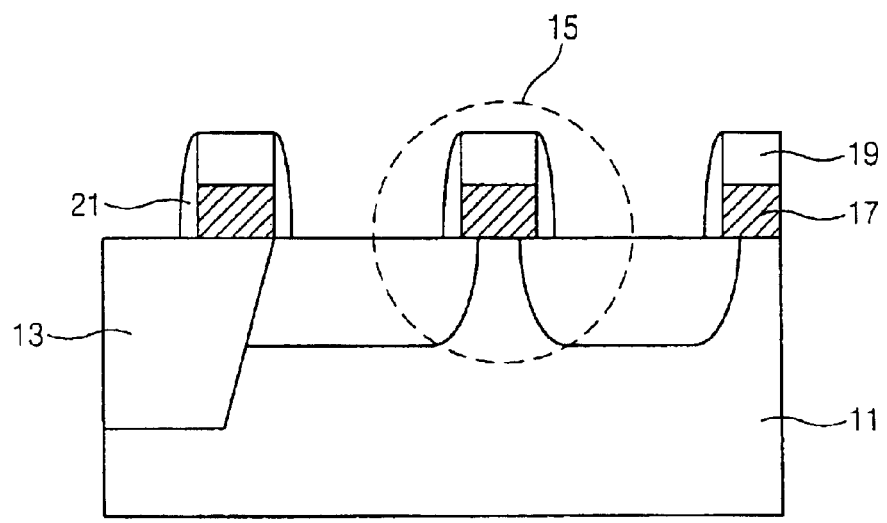
FIGS. 1a through 1e are cross-sectional diagrams illustrating a conventional method for forming a DRAM cell.
Figure 1B:
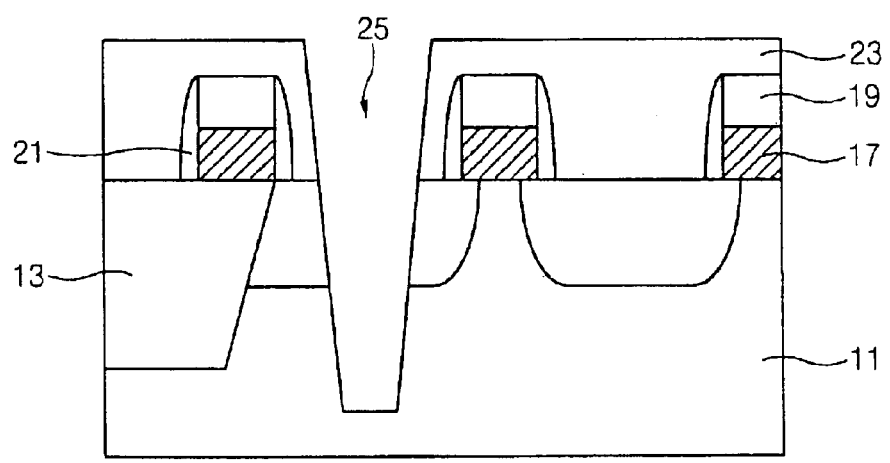
Figure 1C:
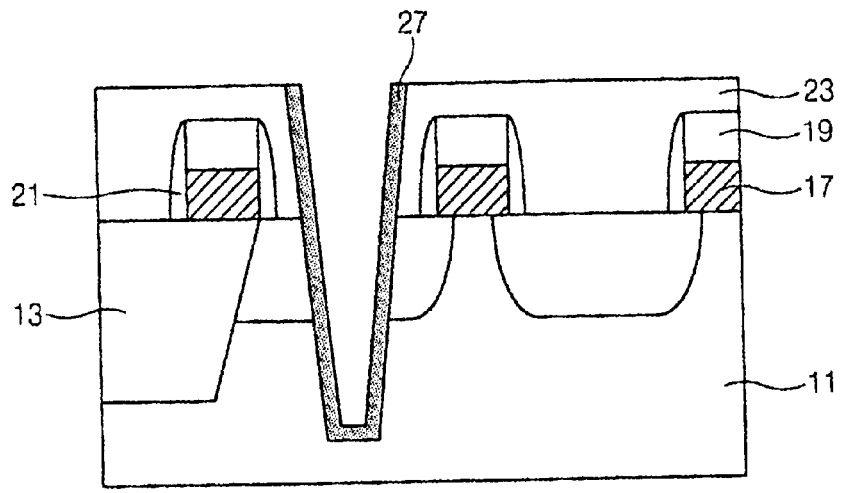
Figure 1D:
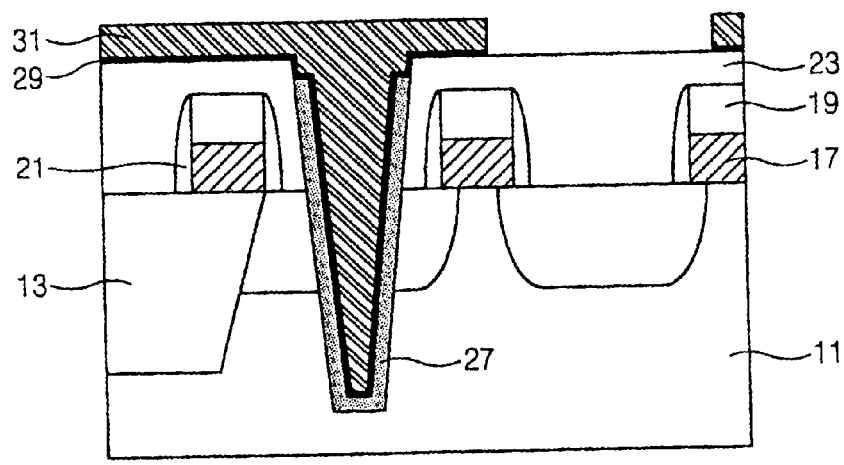
Figure 1E:
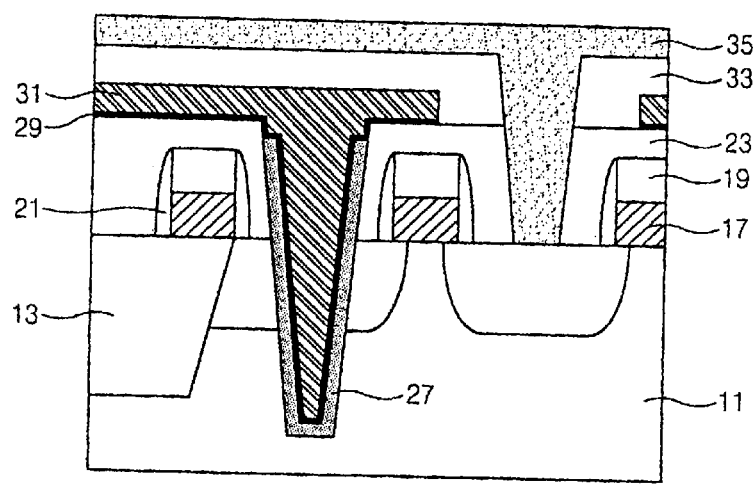
Figure 2A:
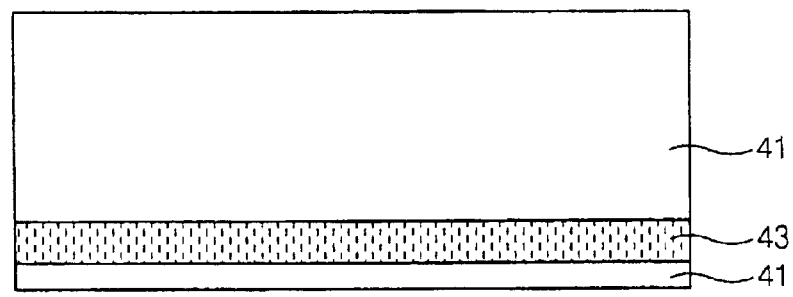
FIGS. 2a through 2g are cross-sectional diagrams illustrating method for forming a DRAM cell in accordance with the present invention.

Referring to FIG. 2a, a high concentration impurity ion, preferably an n-type impurity, is ion-implanted into a semiconductor substrate 41, preferably a p-type substrate, to form an $n^+$ buried layer 43. The $n^+$ buried layer 43 may be formed via an epitaxy process.

Figure 2B:
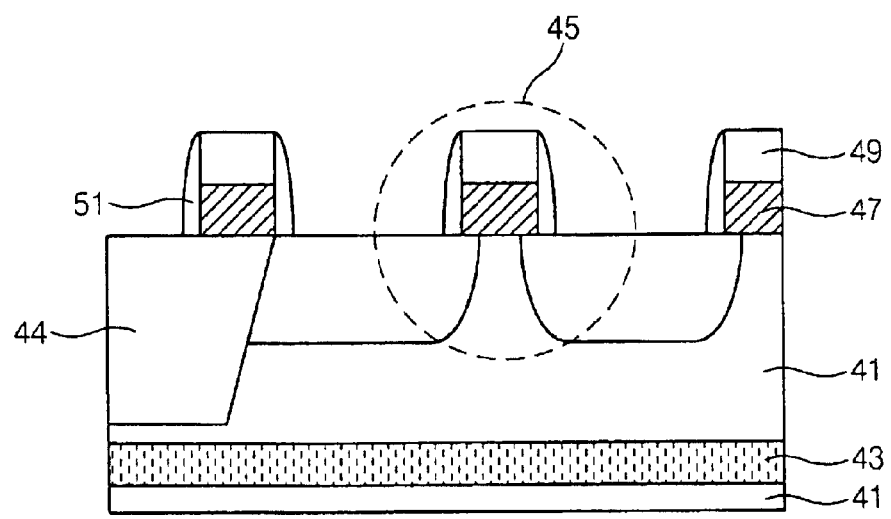

Referring to FIG. 2b, the semiconductor substrate 41 is subjected to an STI (Shallow Trench Isolation) process to form a device isolation film defining an active region.

Thereafter, a main cell MOS transistor 45 having a first gate electrode 47 and a source/drain region is formed on the active region of the semiconductor substrate 41. The first gate electrode 47 has a hard mask layer 49 thereon and a gate oxide film (not shown) thereunder. The gate electrode 47 also has an insulating film spacer 51 is on its side wall.

Figure 2C:
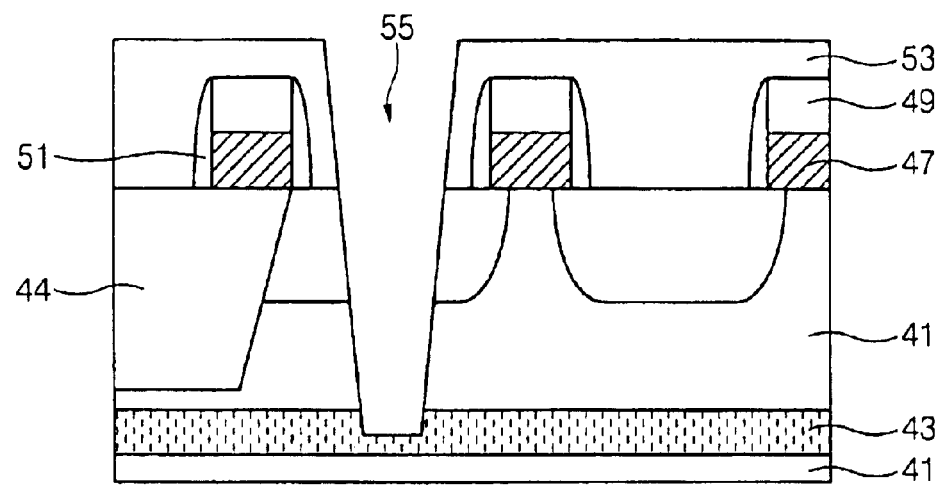

Now Referring to FIG. 2c, a first interlayer insulating film 53 is formed on the entire surface and then planarized.

Thereafter, a portion of the first interlayer insulating film 53 on the drain region of the main cell MOS transistor 45 and the semiconductor substrate 41 are etched via a photolithography process using a storage electrode mask to form a contact hole 55 for storage electrode exposing the semiconductor substrate 41 and $n^+$ buried layer 43.

Figure 2D:
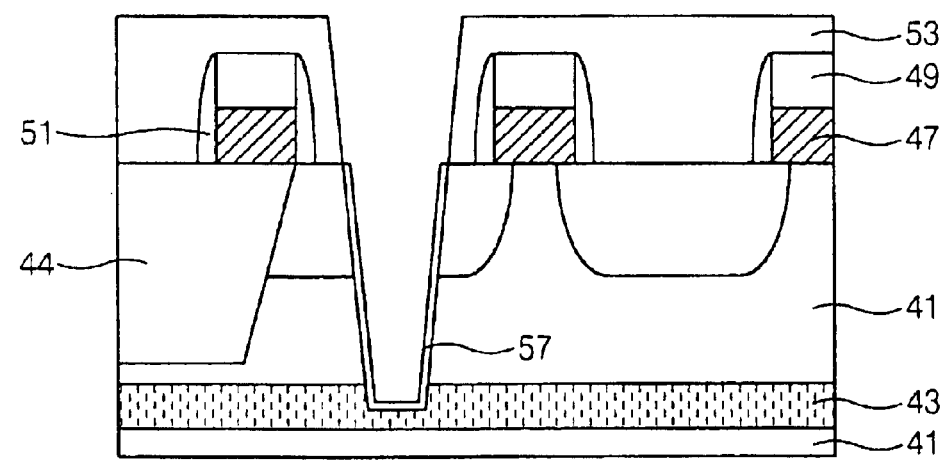

Referring to FIG. 2d, the entire surface including the contact hole 55 is subjected to a tilt ion implantation to implant ions for controlling threshold voltage such as B or $BF_2$.

Thereafter, an oxide film 57 is formed on the surfaces of the semiconductor substrate 41 and the n⁺ buried layer 43 exposed by the contact hole 55 via a thermal oxidation process.

Figure 2E:
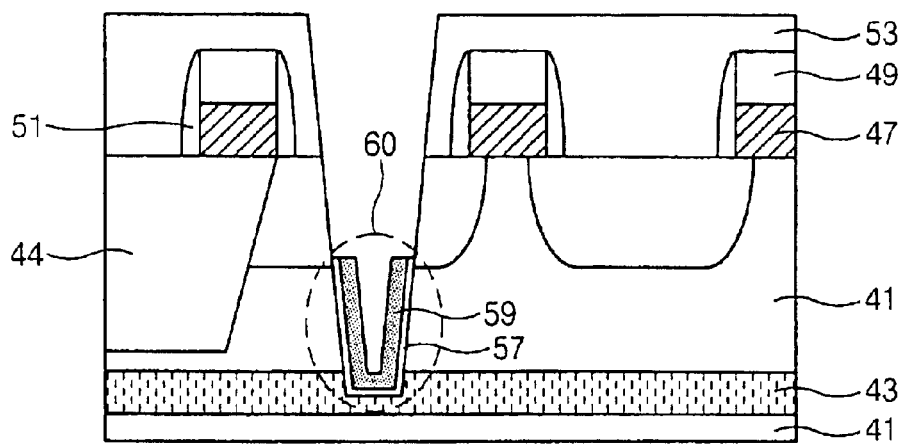

Referring to FIG. 2e, a first liner layer(not shown) is formed on the entire surface including the oxide film 57 using a conductive layer such as a polysilicon layer or a metal layer. The first liner layer is then etched to expose the first interlayer insulating film. Thereafter, a portion of the first liner layer from a upper portion of the contact hole 55 to a lower portion of the drain region is etched to form a second gate electrode 59. The exposed portion of the oxide film 57 is then etched to form a second gate oxide film 57.

This completes the formation of a MOS transistor 60 of vertical structure consisting of the n⁺ buried layer 43, the second gate electrode 59 and the drain region of the main cell MOS transistor 45.

Figure 2F:
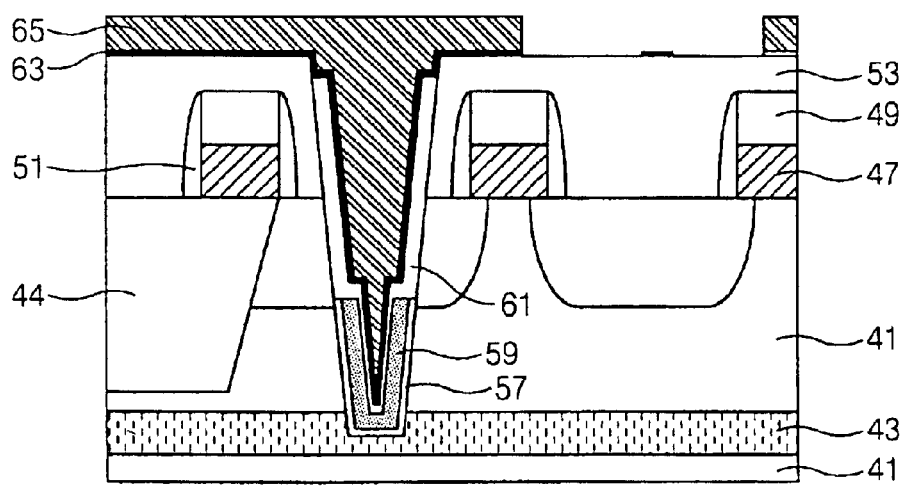

Referring to FIG. 2f, a second liner layer(not shown) is formed on the entire surface including the second gate electrode 59 using a polysilicon layer. The second liner layer is then etched to form a storage electrode 61 on the surface of inner walls of the contact hole 55 and the the second gate electrode 59.

Thereafter, a dielectric film 63 and a polysilicon layer(not shown) for plate electrode are sequentially formed on the entire surface. The polysilicon layer for plate electrode and the dielectric film 63 are etched via a photolithography process using a plate electrode mask to form a plate electrode 65.

Figure 2G:
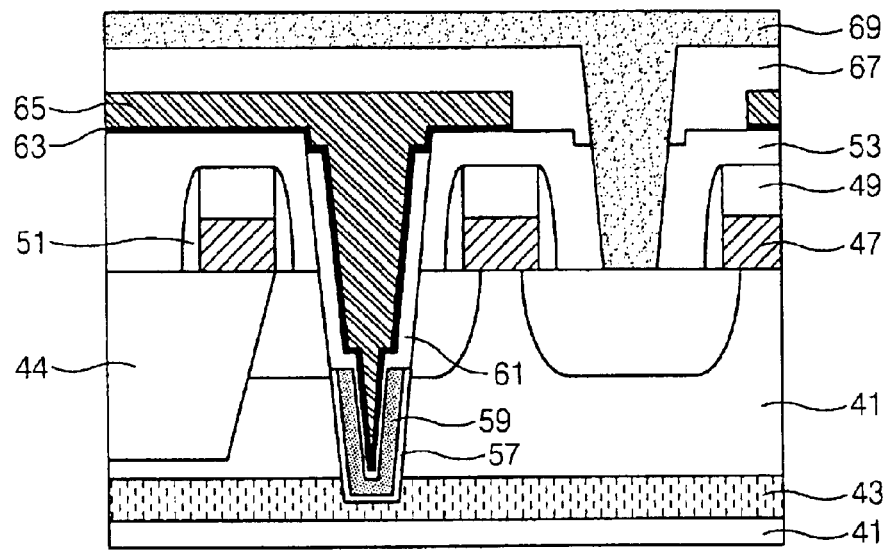

Referring to FIG. 2g, a second interlayer insulating film 67 is formed on the entire surface.

Thereafter, the second interlayer insulating film 67, the first interlayer insulating film 53 and the gate oxide film are etched via a photolithography process using a bit line contact mask (not shown) to form a bit line contact hole exposing the source region of the main cell MOS transistor 45. A bit line 69 is then formed by filling up the bit line contact hole.

Figure 3:
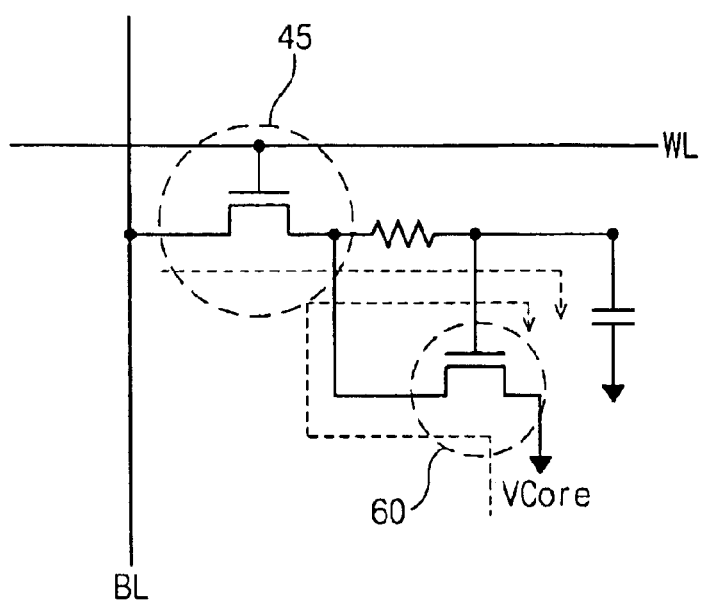
FIG. 3 is a circuit diagram illustrating the DRAM cell in accordance with the present invention.

The operation of the semiconductor device in accordance with the present invention will be described with reference to FIG. 3.

The method for storing data "1" in the capacitor of FIG. 2g with the plate electrode 65 is as follows.

The main cell MOS transistor 45 is first turned on by a voltage applied to the word line WL, and data "1" is stored in the capacitor by a voltage applied via the bit line BL. At the same time, the MOS transistor 60 of vertical structure is also turned on, and voltage $V_{core}$ connected to the drain of the MOS transistor 60 is applied to the capacitor to store data "1".

Even when the main cell MOS transistor 45 is turned off due to data "1" stored in the storage electrode, the voltage applied to the gate electrode of the MOS transistor 60 is maintained at high level. Accordingly, the MOS transistor 60 is maintained at the turned-on state so that the $V_{core}$ is constantly applied to the capacitor.

The method for reading data "1" stored in the capacitor is as follows.

The main cell MOS transistor 45 is turned on by a voltage applied to the word line WL. The data "1" stored in the capacitor is read via the bit line.

The operation for storing data "0" is the same the conventional method. Since the voltage applied to the gate electrode of the MOS transistor 60 is maintained at low level, the MOS transistor 60 is turned off so that the MOS transistor 60 does not effect the operation of the DRAM cell.

As described above, in accordance with the method of the present invention, a semiconductor substrate having an n⁺ buried layer is etched to form a contact hole for storage electrode, and a MOS transistor of vertical structure having the n⁺ buried layer as an impurity region is formed therein. An external source constantly supplies a voltage while data is stored in the storage node to prevent loss of charges due to leakage currents, improve the refresh characteristics, and reduce capacitance required for operation, resulting in high integration of the device.

What is claimed is:

1. A method for forming DRAM cell, comprising the steps of:

forming a buried layer by implanting a high concentration impurity into a semiconductor substrate;

forming a MOS transistor having a first gate oxide film, a first gate electrode, a source and drain region;

forming a planarized first interlayer insulating film on the entire surface;

etching a portion of the first interlayer insulating film on the drain region, the drain region, and a portion of the semiconductor substrate below the drain region to expose the buried layer, whereby forming a contact hole for storage electrode;

forming a vertical MOS transistor in the contact hole by forming a second gate oxide film pattern whose both ends are respectively overlapped on the drain region and a second gate electrode overlapped on the second gate oxide film;

forming a storage electrode on the second gate electrode so that the both ends are respectively extending on the drain region;

forming a dielectric layer and a plate electrode on the storage electrode;

forming a planarized second interlayer insulating film on the entire surface;

sequentially etching the second interlayer insulating film and the first interlayer insulating film on the source region to expose the source region, whereby forming a bit line contact hole; and forming a bit line contacting the source region through bit line contact hole.

* * * * *